(12) United States Patent
Lee

(10) Patent No.: US 10,354,595 B2
(45) Date of Patent: Jul. 16, 2019

(54) ORGANIC LIGHT-EMITTING DIODE PIXEL STRUCTURE

(71) Applicant: AU Optronics Corporation, Hsin-Chu (TW)

(72) Inventor: Chia-Hwa Lee, Hsin-Chu (TW)

(73) Assignee: AU OPTRONICS CORP., Hsin-Chu (TW)

(*) Notice: Subject to any disclaimer, the term of this patent is extended or adjusted under 35 U.S.C. 154(b) by 18 days.

(21) Appl. No.: 15/896,261

(22) Filed: Feb. 14, 2018

(65) Prior Publication Data

US 2018/0174524 A1 Jun. 21, 2018

Related U.S. Application Data

(63) Continuation of application No. 14/619,158, filed on Feb. 11, 2015, now abandoned.

(30) Foreign Application Priority Data

Sep. 26, 2014 (TW) .............................. 103133650 A

(51) Int. Cl.
*G09G 3/30* (2006.01)
*G09G 3/3275* (2016.01)
(Continued)

(52) U.S. Cl.
CPC .......... *G09G 3/3275* (2013.01); *H01L 27/326* (2013.01); *H01L 27/3211* (2013.01);
(Continued)

(58) Field of Classification Search
CPC .................. G09G 3/3208; G09G 3/364; G09G 2300/00–0895; G09G 2340/0457;
(Continued)

(56) References Cited

U.S. PATENT DOCUMENTS 5,986,401 A 11/1999 Thompson et al.
2006/0255725 A1 11/2006 Kim
(Continued)

FOREIGN PATENT DOCUMENTS

| CN | 1855525 A | 11/2006 |
|---|---|---|
| CN | 103715230 A | 4/2014 |
| EP | 3091578 A1 | 11/2016 |

OTHER PUBLICATIONS

Office Action issued in corresponding China patent application dated Oct. 31, 2016.
(Continued)

*Primary Examiner* — Amr A Awad
*Assistant Examiner* — Aaron Midkiff
(74) *Attorney, Agent, or Firm* — McClure, Qualey & Rodack, LLP

(57) ABSTRACT

An OLED (organic light-emitting diode) pixel structure comprises a substrate, first and second control components, first, second, and complementary electrode layers, and first and second light-emitting layers. The first and second control components are disposed above the substrate and electrically coupled to, respectively, the first and second electrode layers. There are first and second neighborhoods defined in the pixel structure, and the substrate traverses both of the neighborhoods. The first electrode layer is disposed in the first neighborhood and comprises a reflective layer. The first light-emitting layer is disposed on and electrically coupled to the first electrode layer. The second electrode layer is transparent and disposed in the second neighborhood. The second light-emitting layer is disposed on and electrically coupled to the second electrode layer. The complementary electrode layer is disposed on and electrically coupled to the light-emitting layers.

18 Claims, 11 Drawing Sheets

(51) Int. Cl.
    *H01L 27/32* (2006.01)
    *H01L 51/52* (2006.01)
(52) U.S. Cl.
    CPC ...... *H01L 27/3218* (2013.01); *H01L 27/3262* (2013.01); *H01L 27/3276* (2013.01); *H01L 51/5218* (2013.01); *G09G 2300/023* (2013.01)
(58) Field of Classification Search
    CPC ....... H01L 27/32–3297; H01L 51/5215; H01L 51/5234; H01L 51/5323
    USPC .................................................... 345/76, 77
    See application file for complete search history.

(56)          References Cited

U.S. PATENT DOCUMENTS

2012/0007110 A1   1/2012  Seo et al.
2012/0074435 A1   3/2012  Ha et al.
2013/0187131 A1   7/2013  Chung et al.
2014/0077725 A1   3/2014  Lee et al.

OTHER PUBLICATIONS

Office Action issued in corresponding China patent application dated Jun. 28, 2017.

ORGANIC LIGHT-EMITTING DIODE PIXEL STRUCTURE

CROSS-REFERENCE TO RELATED APPLICATIONS

This application is a continuation of the U.S. application Ser. No. 14/619,158, filed Feb. 11, 2015, which claims priority to Taiwan Application Serial Number 103133650, filed Sep. 26, 2014, all of which are herein incorporated by reference in their entireties.

TECHNICAL FIELD

The disclosure relates to a transparent dislay technology, more particularly to a pixel structure for organic light-emitting diodes (OLEDs).

BACKGROUND

A transparent display using OLEDs can be devided into a display region and a penetrative region according to pixels of the display. The display region is disposed with a pixel structure and actually emits light. Since the penetrative region has nothing inside, the back of the display can be seen through a transparent substrate. In a pixel, the penetrative region can overlap the display region, be abreast of the display region, or be among mono-chromatic LEDs. Because the area of the active luminous region is smaller than that of the non-transparent region, the transparent display usually has a lower brightness and a lower contrast of the background.

SUMMARY

According to one or more embodiments, the disclosure provides an OLED pixel structure. In one embodiment, the OLED pixel structure has a first region and a second region and includes a substrate, a first control component, a first electrode layer, a first luminous layer, a second control component, a second electrode layer, a second luminous layer, and an opposite electrode layer. The substrate is extended to the first region and the second region. The first control component is located on the substrate. The first electrode layer is located in the first region, is electrically coupled to the first control component, and includes a reflection layer. The first luminous layer is located on the first electrode layer and electrically coupled to the first electrode layer. The second control component is located on the substrate. The second electrode layer is transparent, is located in the second region, and is electrically coupled to the second control component. The second luminous layer is located on the second electrode layer and is electrically coupled to the second electrode layer. The opposite electrode layer is located on the first luminous layer and the second luminous layer and is electrically coupled to the first luminous layer and the second luminous layer.

According to one or more embodiments, the disclosure provides a display. In one embodiment, the display includes the aforementioned OLED pixel structures and a driving circuit. The OLED pixel structures are arranged in a matrix form. The driving circuit drives the first control components according to first image data to control the first luminous layers to generate a first image according to the first image data. The driving circuit also drives the second control components according to second image data to control the second luminous layers to generate a second image according to the second image data. The first image is opaque, and the second image is transparent or translucent.

BRIEF DESCRIPTION OF THE DRAWINGS

The present disclosure will become more fully understood from the detailed description given herein below for illustration only and thus does not limit the present disclosure, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
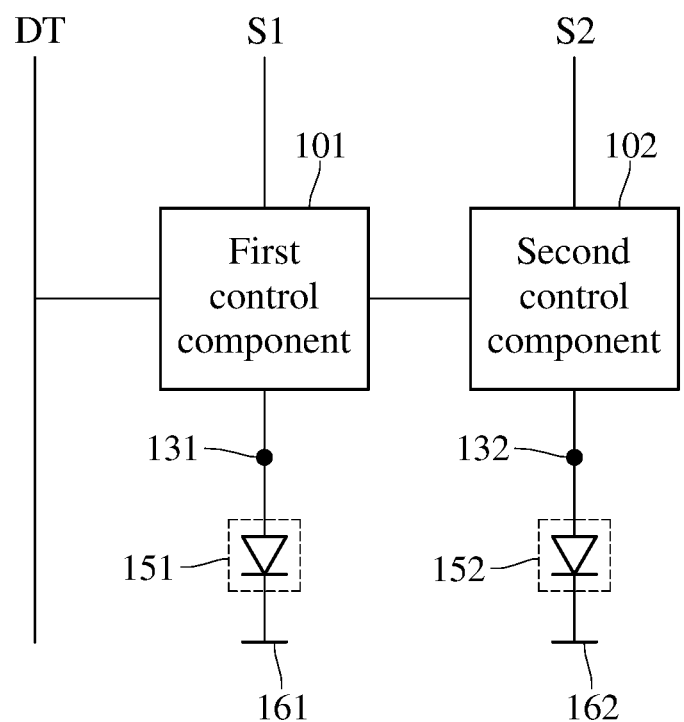
FIG. 1 is a block diagram of an OLED pixel structure according to an embodiment of the disclosure.

FIG. 1 is a block diagram of an embodiment of an OLED pixel structure (as referred to pixel structure hereinafter) in the disclosure. The pixel structure provides two main circuit paths. First one of the two main circuit paths includes, for example, a first control component (as referred to control component hereinafter) 101, a first electrode layer 131, a first luminous layer (as referred to luminous layer hereinafter) 151, and a opposite electrode layer 161 that are electrically coupled to each other. Second one of the two main circuit paths includes, for example, a second control component (as referred to control component hereinafter) 102, a second electrode layer 132, a second luminous layer (as referred to luminous layer hereinafter) 152, and a opposite electrode layer 162 that are electrically coupled to each other.

In this embodiment, the control components 101 and 102 respectively drive the luminous layers 151 and 152 according to a data signal DT. In some embodiments, data received by the control components 101 and 102 can be different to each other. In other words, the control components 101 and 102 are respectively controlled by the control signals S1 and S2 separated. For example, the control signals S1 and S2 can be power or digital control manner. In practice, the first control component 101 can be controlled by or operate according to the control signal S1, or the first luminous layer 151 can indirectly be powered by the control signal S1. When the first control component 101 receives the data signal DT and the first circuit path is enabled, the first luminous layer 151 between the electrode layers 131 and 161 opposite will be driven to emit light. In an embodiment, the first electrode layer 131 functions as an anode terminal while the opposite electrode layer 161 functions as a cathode terminal. In another embodiment, the first electrode layer 131 functions as a cathode terminal while the opposite electrode layer 161 functions as an anode terminal.

Similarly, the second control component 102 is controlled by and operates according to the control signal S2, and the second luminous layer 152 is indirectly powered by the control signal S2. When the second control component 102 receives the data signal through the first control component 101 or by being connected to the first control component 101 in parallel and the second circuit path is enabled, the second luminous layer 152 between the electrode layers 132 and 162 will be driven to emit light. In this embodiment, the opposite electrode layers 161 and 162 are separated from each other. In some embodiments, the luminous layers 151 and 152 share one opposite electrode layer. In other words, the electrode layers 161 and 162 are the same or are electrically connected to each other.

Figure 2:
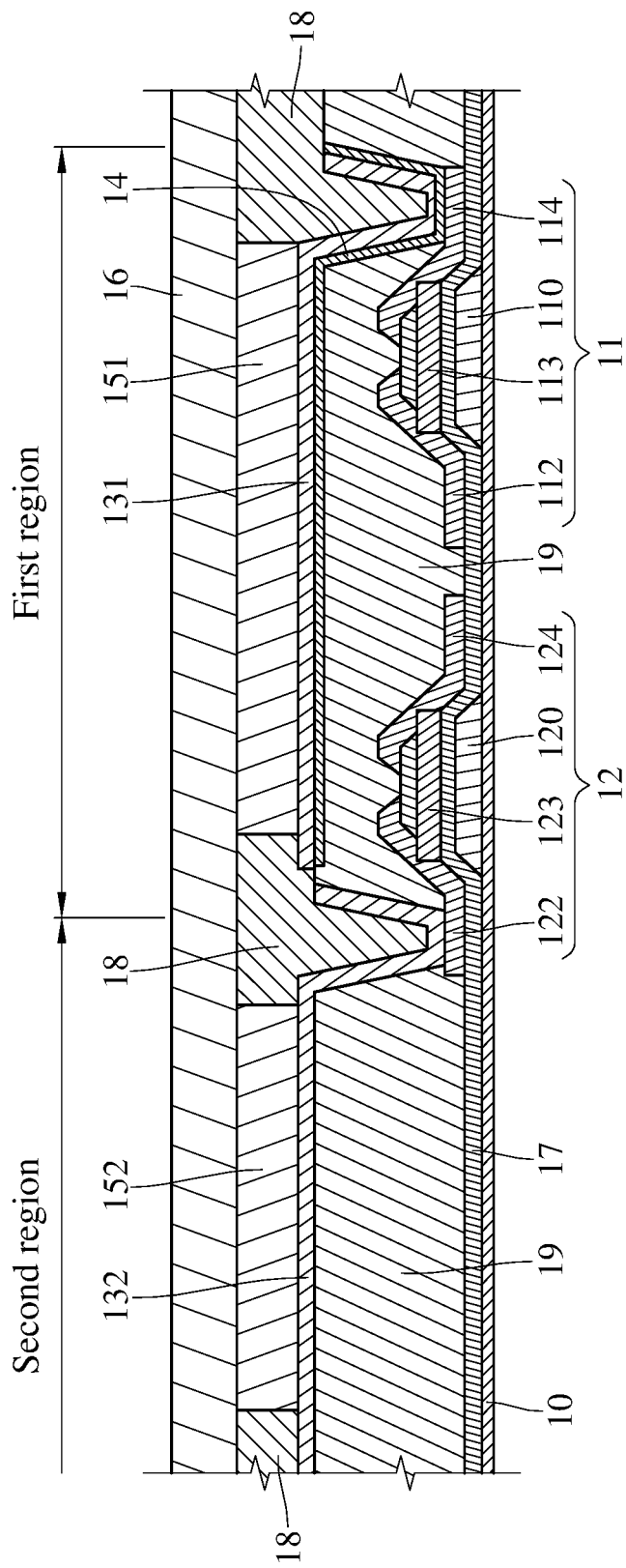
FIG. 2 is a cross-sectional view of the OLED pixel structure according to an embodiment of the disclosure.

FIG. 2 is a cross-sectional view of an embodiment of the OLED pixel structure in FIG. 1 in the disclosure. The pixel structure further includes a substrate 10 and has a first region and a second region. The first region and the second region correspond to the display region and the penetrative region in the art, respectively. The substrate 10 is extended to the two regions. The control components 101 and 102 are located on the substrate 10. The control components 101 includes a first thin film transistor (TFT) 11, and the control component 102 includes a second TFT 12. The first TFT 11 has a first gate terminal 110, a first source/a drain terminal 112, 114, and a first channel 113. The first gate terminal 110 of the first TFT 11 is located on the substrate 10. The first channel 113 is coupled with the terminals 112 and 114 such that charges can flow between the terminals 112 and 114. The first channel 113 is carried by, for example, semiconductor material. One (e.g. the terminal 114) of the terminals 112 and 114 of the first control component 101 is electrically coupled to the first electrode layer 131 in the first region. Specifically, the first electrode layer 131 includes a reflection layer 14, and the first electrode layer 131 in FIG. 2 is the conductive part of the first electrode layer. The reflection layer 14 causes that the first region functions as a display region that is opaque and has high contrast. The reflection layer 14 is made of, for example, metal. In an embodiment, the first electrode layer 131 and the reflection layer 14 are not independent and belong to the same opaque metallic electrode. In other embodiments, the first electrode layer 131 is a transparent electrode made of indium tin oxide (ITO) and is electrically coupled to the reflection layer 14 made of metal. Moreover, the luminous layer 151 on the substrate 10 at least overlaps that of the reflection layer 14 on the substrate 10. In an embodiment, the terminal 114 is electrically coupled to the first electrode layer 131 through the reflection layer 14.

Similarly, the second TFT 12 has a second gate terminal 120, a second source/a drain terminal 122, 124, and a second channel 123. The second gate terminal 120 of the second TFT 12 is located on the substrate 10. The second channel 123 is coupled with the terminals 122 and 124 such that charges can flow between the terminals 122 and 124. The second channel 123 is carried out by, for example, semiconductor material. One (e.g. the terminal 122) of the terminals 122 and 124 of the second control component 102 is electrically coupled to the second electrode layer 132 in the second region. In this embodiment, the control components 101 and 102 are opaque and are disposed in the first region. For a top-emitting pixel structure, the control components 101 and 102 are disposed behind the reflection layer 14. In other words, the control components 101 and 102 can be in the shadow that the reflection layer 14 is projected on the substrate 10.

In an embodiment, the pixel structure in FIG. 2 further includes a gate insulation layer 17 that is on the substrate 10 and also covers on the gate terminals 110 and 120. The control components 101 and 102 are partially located on the gate insulation layer 17. For instance, the thin film transistors 11 and 12 except their gate terminals 110 and 120 are located on the gate insulation layer 17.

The first luminous layer 151 is located on the first electrode layer 131, and the second luminous layer 152 is located on the second electrode layer 132. In the embodiment, the luminous layers 151 and 152 share the opposite electrode layer 16 that is located on the luminous layers 151 and 152. The first electrode layer 131, the first luminous layer 151, and the opposite electrode layer 16 are electrically coupled to each other, and the second electrode layer 132, the second luminous layer 152, and the opposite electrode layer 16 are electrically coupled to each other. The second electrode layer 132 can be made of, for example, transparent material. The second luminous layer 152, the opposite electrode layer 16, and the substrate 10 can be made of, for example, transparent or translucent material. Therefore, the second region can be a penetrative region with a variable transparence value. When the second control component 102 does not operate, the backlight behind or under the substrate 10 can pass through the substrate 10 and travel upon or before the opposite electrode layer 16. When the second control component 102 operates, the second luminous layer 152 will display images with relative lower contrast.

In this or some embodiments, the first region may overlap the second region or not. For example, there is a partition layer 18 between the luminous layers 151 and 152 on the substrate 10, and the first region and the second region in the partition layer 18 partially overlap each other along the horizontal direction of FIG. 2. The first electrode layer 131 may be not electrically coupled to the second electrode layer 132 or the second luminous layer 152 and the second electrode layer 132 may be not electrically coupled to the first luminous layer 151.

In an embodiment, the pixel structure further includes at least one flat layer 19 at least in the first region, especially on the thin film transistors 11 and 12, such that the first electrode layer 131 can be formed on the smooth surface. The flat layer 19 can be made of, for instance, silicon nitride.

Figure 3:
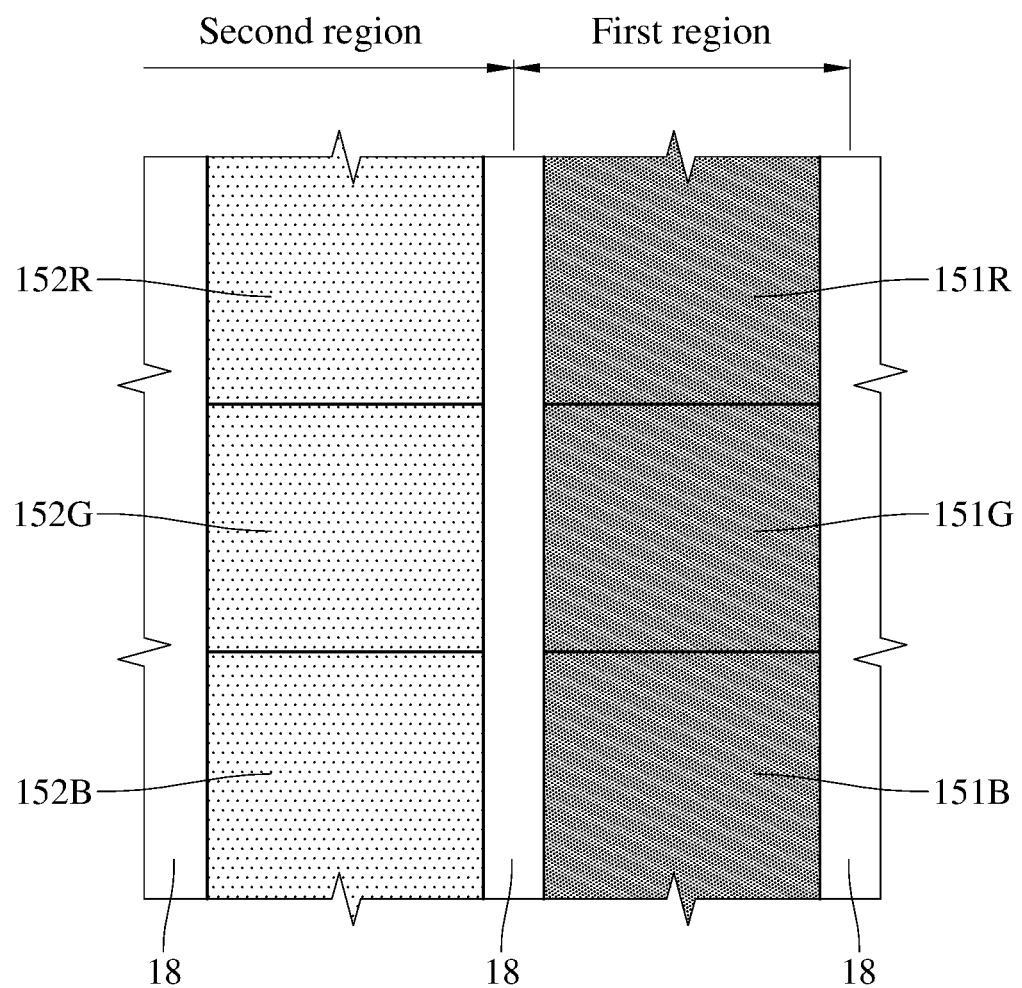
FIG. 3 is a top view of the OLED pixel structure according to an embodiment of the disclosure.

Please refer to FIG. 3 that illustrates a top view of an embodiment of the OLED pixel structure in FIG. 2. FIG. 3 does not show the opposite electrode layer 16 in FIG. 2. The pixel structure includes, for example, first luminous layers 151R, 151G and 151B in the first region and includes, for example, second luminous layers 152R, 152G and 152B in the second region. The first luminous layers 151R, 151G and 151B are electrically coupled to the first electrode layer, and the second luminous layers 152R, 152G and 152B are electrically coupled to the second electrode layer. The first luminous layers 151R, 151G and 151B are separated from the second luminous layers 152R, 152G and 152B by the partition layer 18. In this or some embodiments, the partition layer 18 may be also formed among the first luminous layers 151R, 151G and 151B or among the second luminous layers 152R, 152G and 152B. The luminous layers 151R and 152R emit red light, the luminous layers 151G and 152G emit green light, and the luminous layers 151B and 152B emit blue light. Therefore, red, green and blue light emitted by these luminous layers in the pixel structure can be mixed to form full color. In FIG. 3, the first luminous layers 151R, 151G and 151B are marked by dense meshes to present that the first region is opaque because of the reflection layer 14, and the second luminous layers 152R, 152G and 152B are marked by sparse meshes to present that the second region is transparent or translucent. Since pixels for an entire frame image shown on the display are adjacent, each first luminous layer is regularly adjacent to one of the second luminous layers.

Figure 4A:
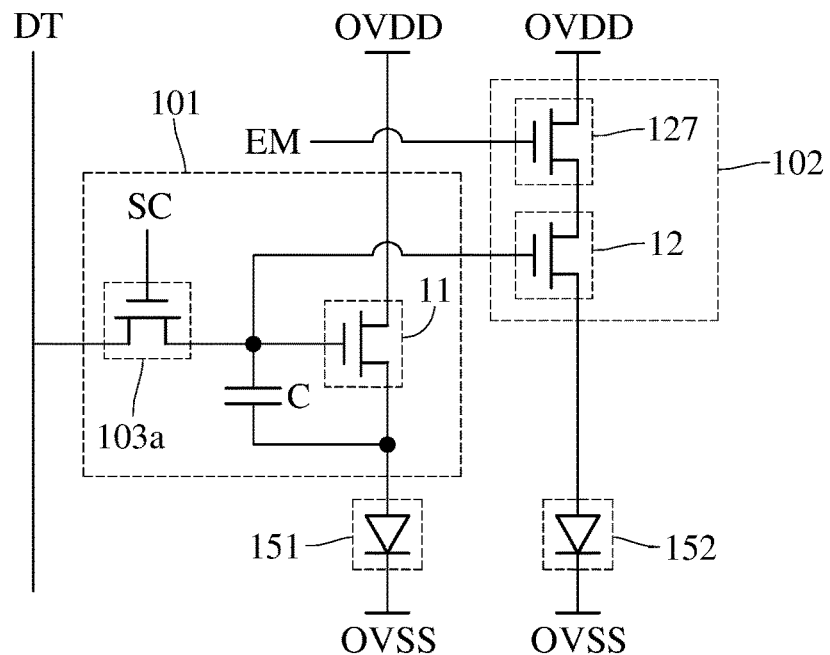
FIGS. 4A to 7 are schematic diagrams of the OLED pixel structure in different embodiments.

The following exemplary embodiments of pixel structure derived from FIG. 1 are laid below. As shown in FIG. 4A, the control components 101 and 102 are carried out by n-type metal-oxide-semiconductor field-effect transistors (nMOSFET). As shown in FIG. 4A, the switch unit 103a (e.g. an nMOSFET) controlled by the scan signal SC cooperates with the capacitor C to support the control components 101 and 102 to receive the data signal DT. The scan signal SC can cause the switch unit 103a on or off. When the switch unit 103a is on, the data signal DT is sent to the first gate terminal 110 so the first TFT 11 can provide the luminous layer 151 with electricity according to the data signal DT. In practice, the first gate terminal 110 is electrically coupled to the switch unit 103a, the terminal 112 receives the input voltage OVDD, and the capacitor C affects the voltage between the first gate terminal 110 and the terminal 114. The second control component 102 further includes a switch unit 127. The gate terminal of the switch unit 127 is controlled by a switch signal EM, and the source or drain terminal receives the input voltage OVDD. Similar to the control components 101 and 102 in FIG. 1 respectively controlled by the control signals S1 and S2, the input voltage to the first TFT 11 and the switch unit 127 can be the input voltage OVDD or be different. The terminal 124 of the second TFT 12 is electrically coupled to the switch unit 127, and the terminal 122 is electrically coupled to the second electrode layer 132. The second gate terminal 120 of the second TFT 12 is electrically coupled to the switch unit 103a, the first gate terminal 110, and the capacitor C to receive the data signal DT. In other embodiments, the second gate terminal 120 of the second TFT 12 is electrically coupled to other data resources. In other embodiments, the first gate terminal 110 of the first TFT 11 is electrically coupled to a first data line, and the second gate terminal 120 of the second TFT 12 is electrically coupled to a second data line. Two data signals respectively provided by the first data line and the second data line are different. In other words, the data signal (referred to as the first data signal) sent from the first data line to the first control component 101 and the data signal (referred to as the second data signal) sent from the second data line to the second control component 102 have difference in data content therebetween such that the luminous layers 151 and 152 may have a difference in performance therebetween. The electrode layers 131 and 132 are electrically coupled to the luminous layers 151 and 152, respectively. In this embodiment, the luminous layers 151 and 152 are electrically connected to the opposite electrode layer 16, as shown by the output voltage OVSS in FIG. 4A.

The operation of the pixel structure is described as follows by referring to FIGS. 2 and 4A. When the scan signal SC to the gate terminal of the switch unit 103a is at a high voltage level, the switch unit 103a will be on such that the data signal DT passes through the switch unit 103a to power the first gate terminal 110 of the first TFT 11 and the capacitor C. Since the switch unit 103a is turned on, the capacitor C stores electricity and voltage level of the data signal DT and changes the voltage difference between the gate terminal and source terminal of the first TFT 11 so as to control the current flowing through the first TFT 11. The first luminous layer 151 is driven to emit light according to the current generated from the voltage distance between the input voltage OVDD and an output voltage OVSS and the equivalent circuit load. When the scan signal SC at the gate terminal of the switch unit 103a is at a low voltage level, the switch unit 103a will be off and the data signal DT will be blocked by the switch unit 103a. Therefore, the first TFT 11 is off, and the first luminous layer 151 does not emit light.

As shown in FIG. 4A, when the switch unit 103a is on according to the scan signal SC, the capacitor C decides the voltage on the second gate terminal 120 of the second TFT 12. When the switch signal EM to the gate terminal of the switch unit 127 is at a high voltage level, the switch unit 127 will be on and the data signal DT will control the current flowing through the second TFT 12. Therefore, the second luminous layer 152 is driven to emit light according to the current generated by the voltage difference between the input voltage OVDD and the output voltage OVSS and the equivalent circuit load. When the scan signal SC to the gate terminal of the switch unit 103a is at a low voltage level or when the switch signal EM to the gate terminal of the switch unit 127 is at a low voltage level, the switch unit 103a or the switch unit 127 will be off. Herein, the data signal DT will be blocked by the switch unit 103a, and the current to the switch unit 127 and the second TFT 12 will be blocked by the switch unit 127. Therefore, when the switch unit 103a or the switch unit 127 is off, the second luminous layer 152 will not emit light.

Figure 4B:
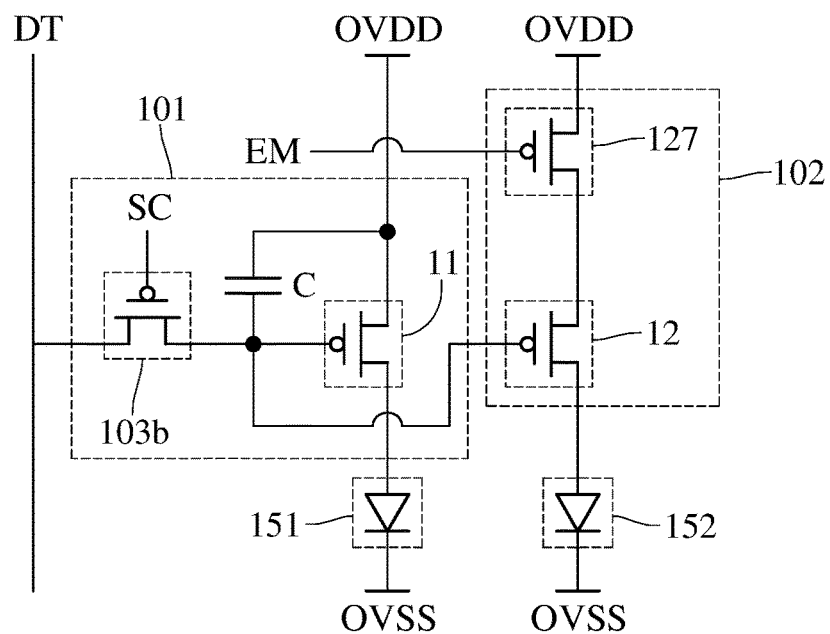

In another embodiment, the control components 101 and 102 are carried out by p-type metal-oxide-semiconductor field-effect transistors (pMOSFET). As shown in FIG. 4B, the switch unit 103b (e.g. a pMOSFET) controlled by the scan signal SC cooperates with the capacitor C to support the control components 101 and 102 to receive the data signal DT.

It shoulde be notice that the thin film transistors 11 and 12 may be different or the same in standard or size, and the switch unit 103a (or 103b) and the switch unit 127 may be different or the same in standard or size. In practice, the luminous layers 151 and 152 can achieve the best brightness scheme by adjusting the aspect ratios of the TFTs 11 and 12 during the manufacture, whereby the actively-display and transparency of the pixel structure may harmonize.

Figure 4C:
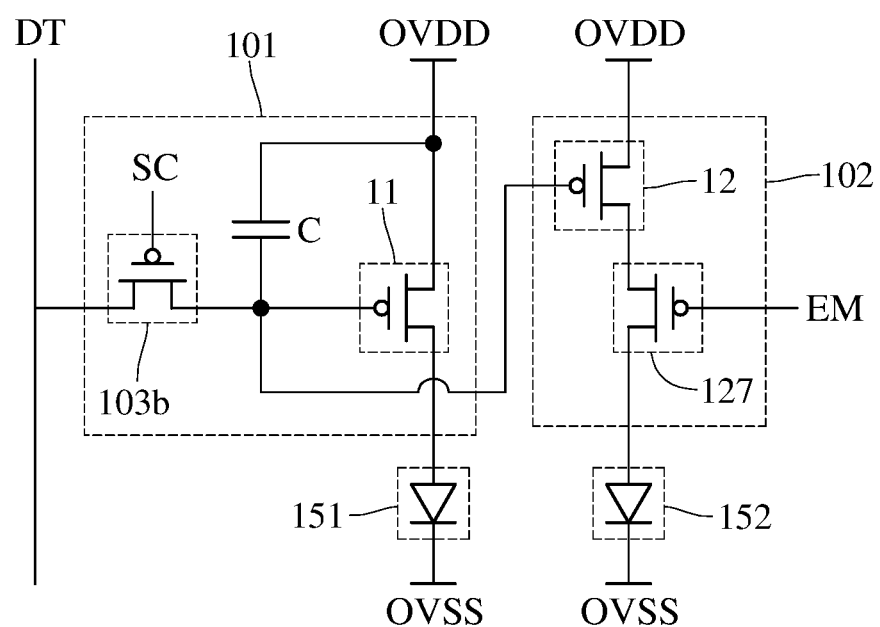

In another embodiment shown in FIG. 4C, the terminal 124 of the second TFT 12 receives the input voltage OVDD, and the terminal 122 of the second TFT 12 is coupled with the second electrode layer 132 through the switch unit 127. Therefore, the second gate terminal 120 and the terminal 124 have a stable and higher voltage therebetween, thereby positively affecting the current passing through the second luminous layer 152 and the brightness of light emitted by the second luminous layer 152. The locations of the second TFT 12 and the switch unit 127 in FIG. 4C are the reverse of those in FIG. 4B. The control components 101 and 102 and the switch unit 103b in FIG. 4C are carried out by pMOS-FETs. The switch unit 103b is controlled by the scan signal SC. The capacitor C affects the voltage difference between the first gate terminal 110 and the terminal 112. The first gate terminal 110 of the first TFT 11 and the second gate terminal 120 of the second TFT 12 are coupled with the switch unit 103a and the capacitor C to receive the data signal DT.

Figure 5A:
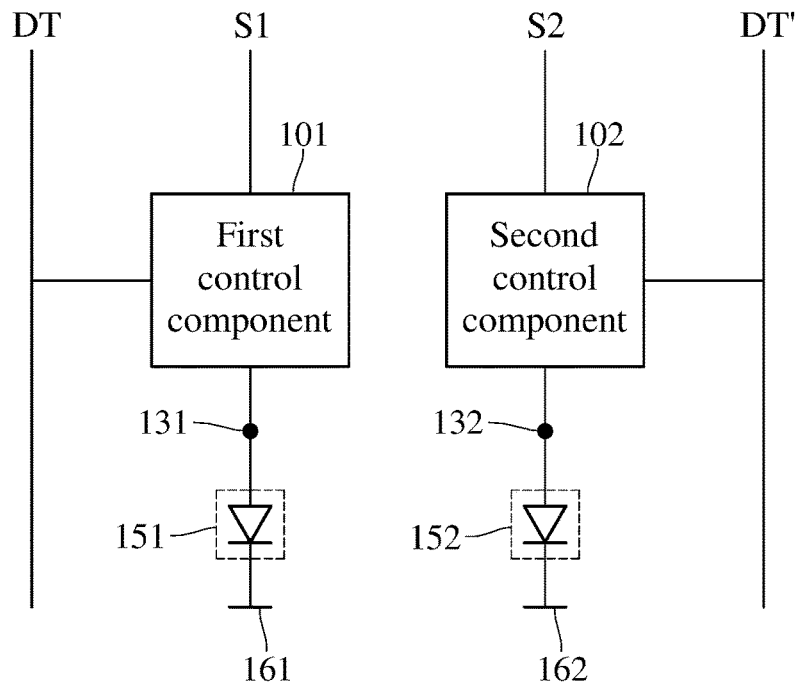

FIG. 5A is a schematic diagram of an embodiment of an OLED pixel structure in the disclosure. The pixel structure mainly has two main circuit paths, the first one includes a first control component 101, a first electrode layer 131, a first luminous layer 151, and a opposite electrode layer 161, and the second one includes a second control component 102, a second electrode layer 132, a second luminous layer 152, and a opposite electrode layer 162. The first control component 101, the first electrode layer 131, the first luminous layer 151, and the opposite electrode layer 161 are electrically coupled to each other, and the second control component 102, the second electrode layer 132, the second luminous layer 152, and the opposite electrode layer 162 are electrically coupled to each other.

The control component 101 receives a data signal DT to drive the first luminous layer 151, and the control component 102 receives a data signal DT' to drive the second luminous layer 152. Alternately, the control components 101 and 102 can receive other different data, that is, the control components 101 and 102 are controlled by two independent control signals S1 and S2, respectively. For example, the control signals S1 and S2 are power or digital control manner. In practice, the control signal S1 can drive the first control component 101 to operate or not or can indirectly provide the first luminous layer 151 with electricity. When the first control component 101 under operation receives the data signal DT, the first circuit path is enabled and the first luminous layer 151 between the opposite electrode layers 131 and 161 is driven to emit light. In an embodiment, the first electrode layer 131 is anode as the opposite electrode layer 161 is cathode. In another embodiment, the first electrode layer 131 is cathode as the opposite electrode layer 161 is anode.

Figure 5B:
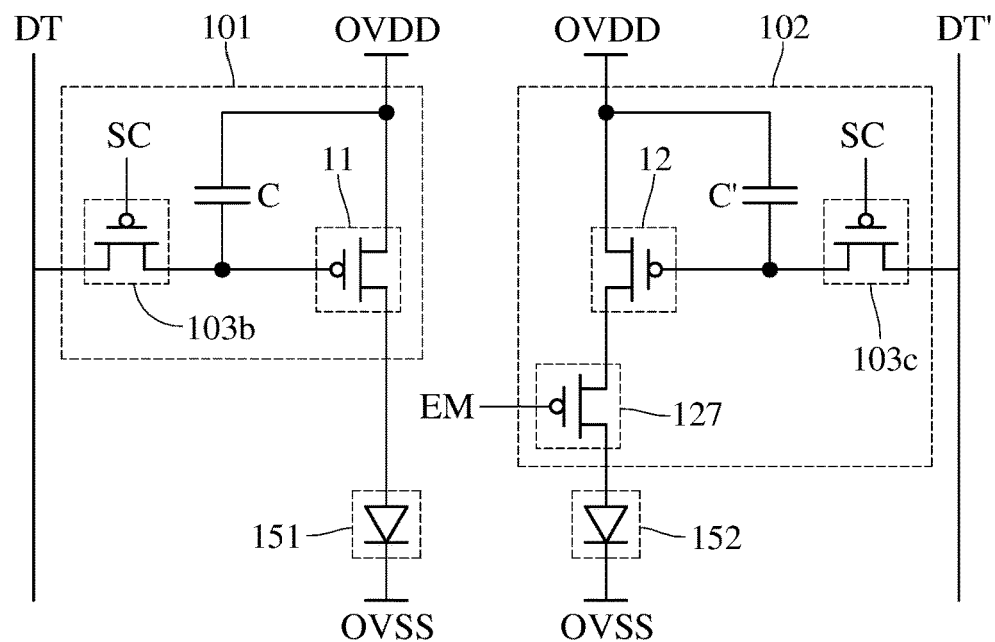

In practice, the second control component 102 and the first control component 101 can respectively connect to different data sources. Therefore, the penetrative region of the pixel structure can have higher contrast and brightness, and the first luminous layer and the second luminous layer in the same pixel are driven by different data to form two different images that are combined to form a frame image shown on the display. By modulating the currents respectively flowing through the luminous layers 151 and 152, the image formed by the display region and the image formed by the penetrative region can be combined by any suitable ratio, and alternately, pixels in the penetrative region can display an image different from that displayed by the display region (i.e. a non-penetrative region). As shown in FIG. 5B, the switch unit 103c is controlled by the scan signal SC cooperates with the capacitor C' to support the second control component 102 to receive a data signal DT'. The switch unit 103c and the switch unit 103b are synchronous. The second gate terminal 120 of the second TFT 12 is electrically coupled to the switch unit 103c, the terminal 122 of the second TFT 12 is electrically coupled to the second electrode layer 132 and the second luminous layer 152 through the switch unit 127. The terminal 124 is supplied with the input voltage OVDD. The capacitor C' affects and stores the voltage between the terminal 124 and the second gate terminal 120. The input voltage OVDD, the scan signal SC, and the switch signal EM in FIG. 5B can correspond to the control signals S1 and S2 in FIG. 5A. The luminous layers 151 and 152 are electrically connected to the opposite electrode layers 161 and 162 respectively, as shown by the output voltage OVSS in FIG. 5B. In one embodiment, the opposite electrode layers 161 and 162 belong to the opposite electrode layer 16 in practice. Alternately, the opposite electrode layers 161 and 162 are seperated from each other and respectively belong to two independent electrodes in physical structure. The operation of the circuit in FIG. 5B can be referred to that in FIG. 4A and will not be repeated hereinafter.

Figure 6:
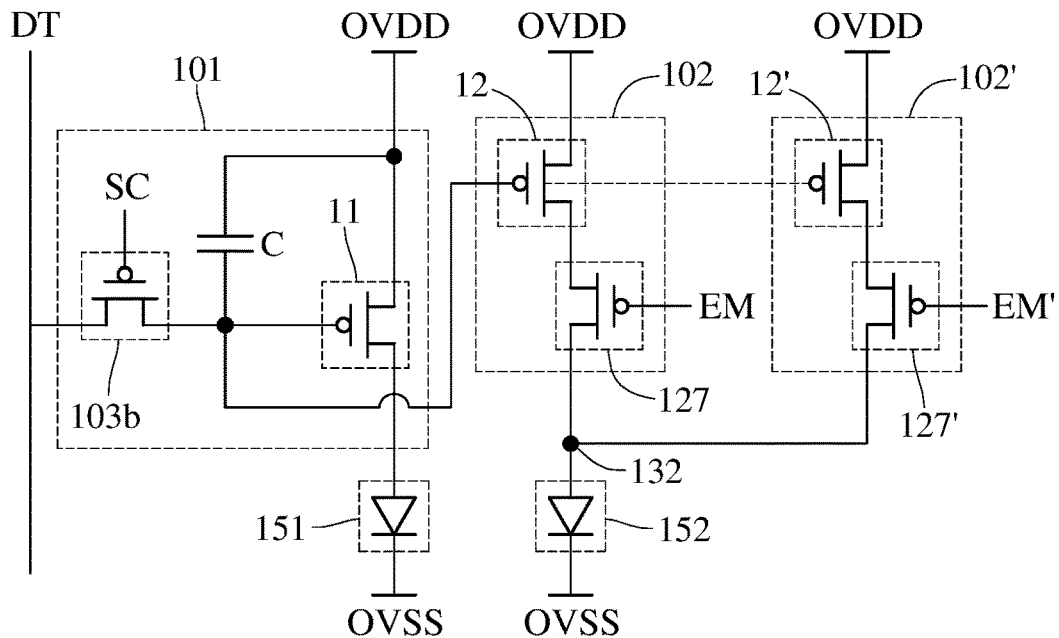
Figure 7:
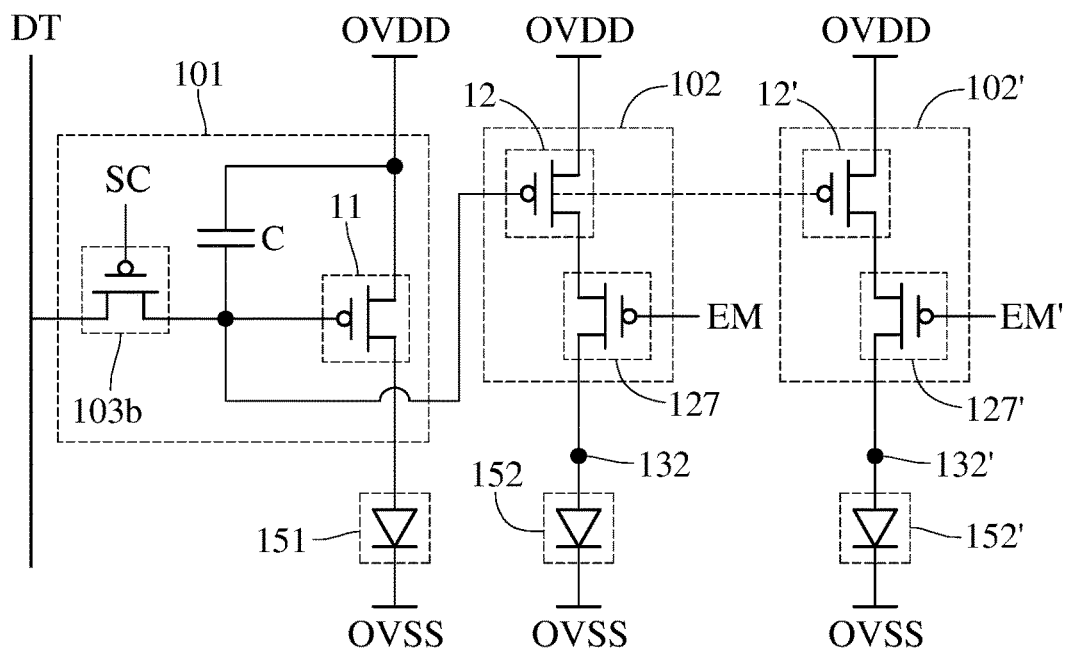

The above brightness scheme can dynamically be changed. In practice, the substrate 10 is also in a third region of the pixel structure, and the pixel structure can further include a third control component 102' on the substrate 10 (e.g. on the first region). As shown in FIG. 6 and FIG. 7, the third control component 102' includes the third TFT 12' and the third switch unit 127'. The third TFT 12' and the third switch unit 127' are connected in series. The gate terminal of the third TFT 12' is coupled with the switch unit 103b and is controlled by the scan signal SC. In an embodiment shown in FIG. 6, the third control component 102'is connected to the second control component 102 that includes the second TFT 12 and the switch unit 127 connected in series in FIG. 4. The third switch unit 127' is coupled with the second electrode layer 132. The TFT 12 and 12' can have difference in aspect ratio so that no matter when the control components 102 and 102' operate together or not, the second luminous layer 152 can be driven differently to change the saturation degree of the entire pixel structure.

In other embodiment shown in FIG. 7, a third control component 102' is electrically coupled to a third electrode layer 132' in the third region, a third luminous layer 152' is on the third electrode layer 132', and the opposite electrode layer 16 marked by the output voltage OVSS is on the third luminous layer 152'. The third TFT 12', the third electrode layer 132', and the third luminous layer 152' in the pixel structure can be arranged by referring to the arrangement of the second TFT 12, the second electrode layer 132, and the second luminous layer 152 in FIG. 2. For example, the third TFT 12' has a third gate terminal, a third source terminal, a third drain terminal, and a third channel. The third gate terminal of the third TFT 12' is on the substrate 10. The third channel of the third TFT 12' is coupled with the third source terminal and drain terminal of the third TFT 12' such that electric charges can flow between the third source terminal and drain terminal of the third TFT 12'. The third channel can be made of semiconductor material. One of the third source terminal or third drain terminal of the third control component 102' (e.g. the third source terminal) is electrically coupled to the third electrode layer 132' in the third region. The control components 101, 102 and 102' are opaque and are in the first region. For a top-emitting pixel structure, these control components are behind the reflection layer 14. In other words, the control components 101, 102 and 102' can be in the shadow that the reflection layer 14 is projected on the substrate 10.

The third electrode layer 132', the third luminous layer 152', and the opposite electrode layer 16 are electrically coupled to each other. Since the third TFT 12', the third switch unit 127', and the third luminous layer 152' in FIG. 7 can be designed in their specification according to actual requirements, the pixel structure in FIG. 7 is more elastic than that in FIG. 6.

Figure 8A:
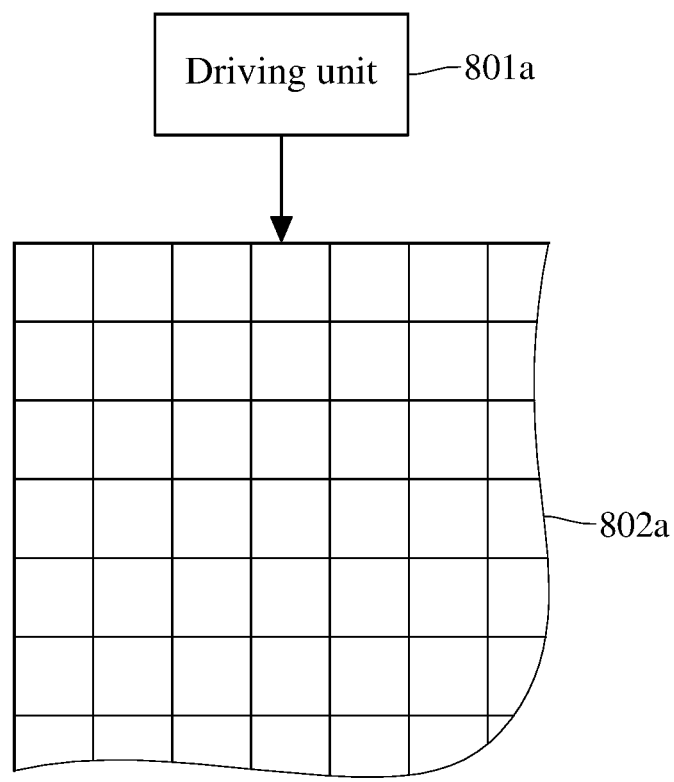
FIG. 8A is a schematic diagram of a display according to an embodiment of the disclosure.

FIG. 8A is a schematic diagram of an embodiment of a display in the disclosure. The display includes, for example, a driving circuit 801a and a pixel matrix 802a. The driving circuit 801a is coupled with the pixel matrix 802a to output a scan signal SC and a data signal DT to the pixel matrix 802a so that pixels of the pixel matrix 802a are driven to emit light to display images. The pixel matrix 802a is carried out by the pixel structure in the disclosure. The pixel structure has, for example, the aforementioned first region and the aforementioned second region.

Figure 8B:
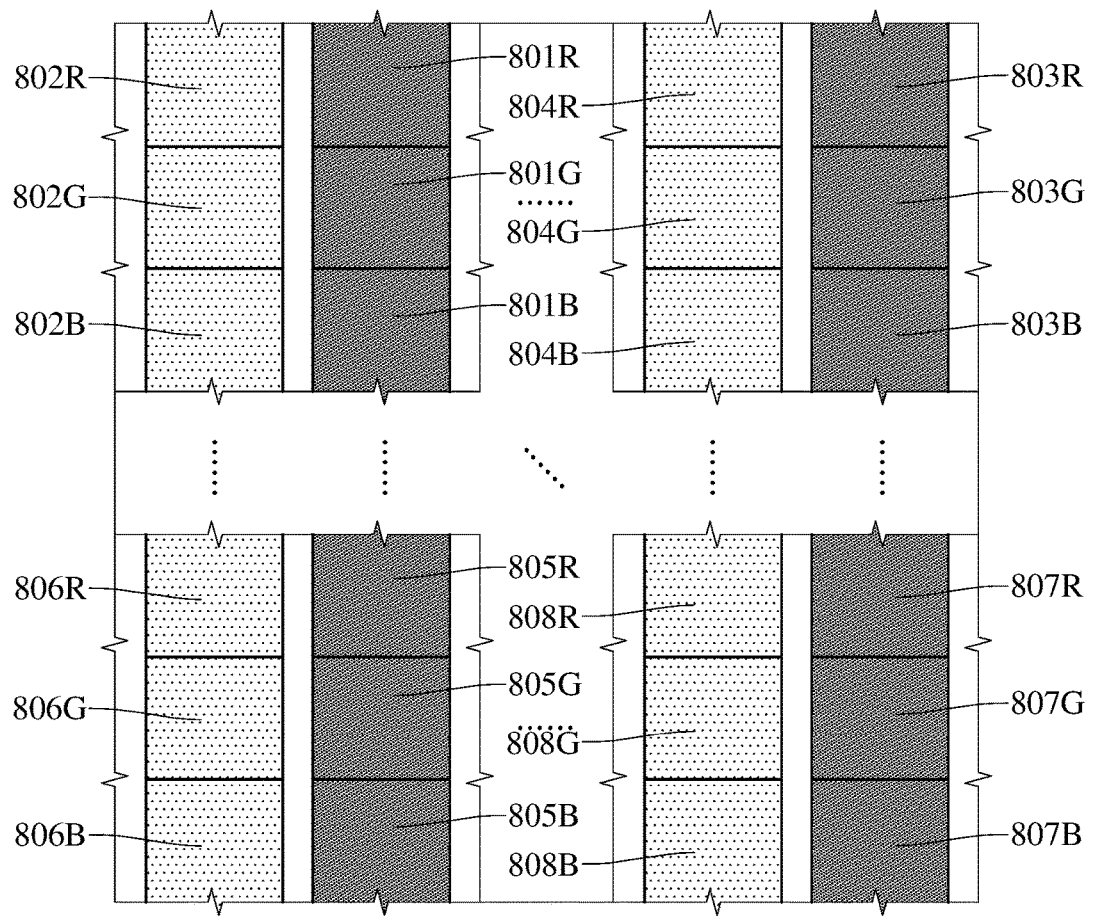
FIG. 8B is a schematic diagram of a pixel matrix in the display according to an embodiment of the disclosure.

FIG. 8B is a top view of an embodiment of the pixel matrix 802a where the aforementioned opposite electrode layer 16 of each pixel structure is not shown. The adjacent pixels in the pixel matrix 802a are arranged as shown in FIG. 8B so that first regions (or second regions) of pixels in the same pixel line are aligned as a first line and second regions of pixels in the same pixel line are aligned as a second line. The first lines and the second lines are separated from each other by blocking layers, and each first line is between adjacent two of the second lines. For example, first luminous layers 801R, 801G, 801B, 805R, 805G and 805B in the first regions of a pixel line are aligned in one first line while first luminous layers 803R, 803G, 803B, 807R, 807G and 807B in the first regions of another pixel line are aligned in one adjacent first line. Similarly, second luminous layers 802R, 802G, 802B, 806R, 806G and 806B in second regions of a pixel line are aligned in one second line while second luminous layers 804R, 804G, 804B, 808R, 808G and 808B in second regions of another pixel line are aligned in one adjacent second line. The first and second lines (i.e. the pixel lines) are vertically arranged in parallel as shown in FIG. 8B. Alternately, the first and second lines (i.e. the pixel lines) are horizontally arranged in parallel or have any angle with a horizontal line of the drawing.

The pixel structure may further include the aforementioned first luminous layer 151 in the first region, the aforementioned second luminous layer 152 in the second region, the aforementioned first control component 101, and the aforementioned second control component 102. The first control component 101 is controlled by the scan signal SC and the data signal DT to drive the first luminous layer 151 to emit light, and the second control component 102 is controlled by the scan signal SC and the data signal DT to drive the second luminous layer 152 to emit light.

Figure 9A:
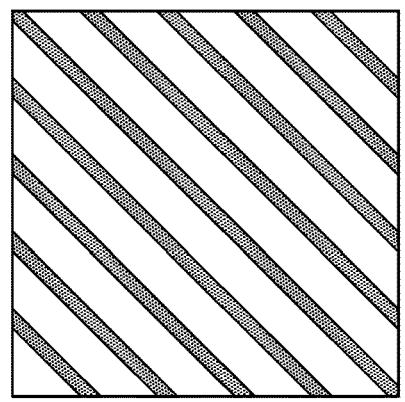
FIG. 9A is a schematic diagram of a first image displayed by the first luminous layer according to an embodiment of the disclosure.
Figure 9B:
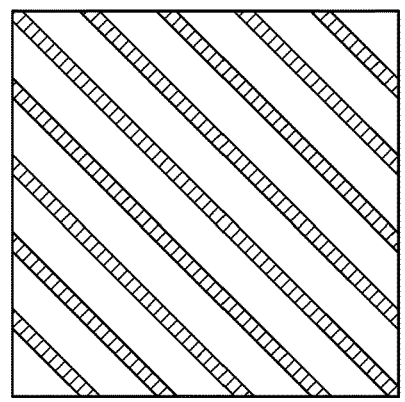
FIG. 9B is a schematic diagram of a second image displayed by the second luminous layer according to an embodiment of the disclosure.
Figure 9C:
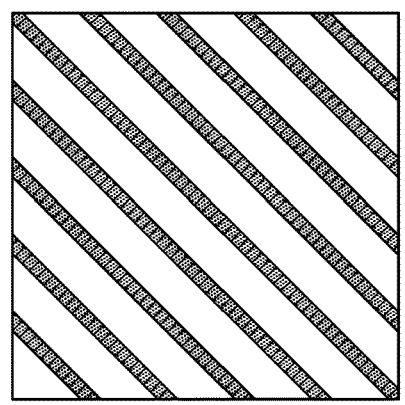
FIG. 9C is a schematic diagram of a frame image shown on the display according to an embodiment of the disclosure.

Please refer to FIGS. 9A, 9B and 9C. FIG. 9A schematically illustrates the first image displayed by the first luminous layer 151, FIG. 9B schematically illustrates the second image displayed by the second luminous layer 152, and the FIG. 9C schematically illustrates the frame image shown on the display. The first and second images in FIG. 9A and FIG. 9B and the frame image in FIG. 9C are simply drawn by different straight sloping lines with different meshes and can be dynamic images. Two different straight sloping lines represent two different transparency values of image, respectively.

As shown in FIGS. 9A, 9B and 9C, in an embodiment, the driving circuit 801a drives the first luminous layer 151 and the second luminous layer 152 by the data signal DT to emit light of images for the display to display. Specifically, the light emitted by the first luminous layer 151 forms a first image that is opaque, as shown in FIG. 9A. The light emitted by the second luminous layer 152 forms a second image that is transparent or translucent, as shown in FIG. 9B. The first and second images are combined to form a combined frame image on screen, as shown in FIG. 9C. In this embodiment, because the first luminous layer 151 and the second luminous layer 152 are driven by the data signal DT, the first image 151 and the second image 152 have difference in brightness and contrast but show image information carried by the data signal DT. The driving circuit 801a adjusts the current flowing through the first luminous layer 151 and the current flowing through the second luminous layer 152, to control the luminances of the first luminous layer 151 and the second luminous layer 152. Controlling the luminances of the first luminous layer 151 and the second luminous layer 152 is to control the contrast and brightness of the first image and the contrast and brightness of the second image, whereby the ratio of the first image to the second image can be controlled during the combination of the first and second images to harmonize the brightness or contrast of frame images.

Figure 10A:
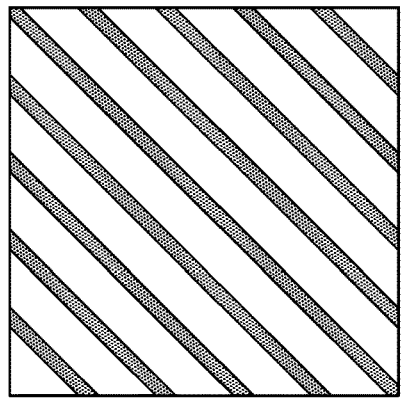
FIG. 10A is a schematic diagram of a first image displayed by the first luminous layer according to another embodiment of the disclosure.
Figure 10B:
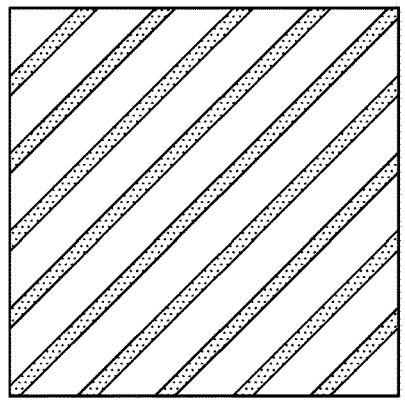
FIG. 10B is a schematic diagram of a second image displayed by the second luminous layer according to another embodiment of the disclosure.
Figure 10C:
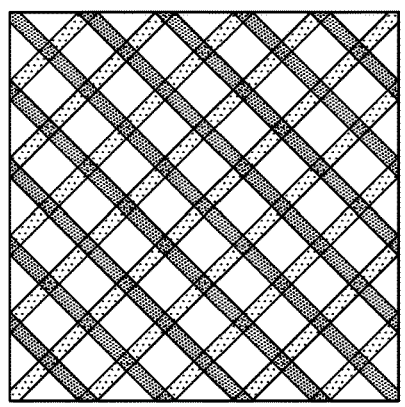
FIG. 10C is a schematic diagram of a frame image shown on the display according to another embodiment of the disclosure.

In another embodiment, FIGS. 10A to 10C also illustrate the first image, the second image, and the frame image respectively, and the drawing manner in FIGS. 10A to 10C can be referred to that in FIGS. 9A to 9C and will not be repeated hereinafter. The driving circuit drives the first luminous layer 151 by the data signal DT and drives the second luminous layer 152 by another data signal DT'. Different from the embodiment illustrated by FIGS. 9A to 9C, the display in this embodiment illustrated by FIGS. 10A to 10C drives the first luminous layer 151 and the second luminous layer 152 respectively by different signals. Therefore, the image content, brightness, and/or contrast of the first image are different from those of the second image while the frame image on the display simultaneously shows the first image 151 and the second image 152. The driving circuit adjusts the current flowing through the first luminous layer and the current flowing through the second luminous layer to control the light-emitting of the first luminous layer 151 and the second luminous layer 152. Controlling the light-emitting of the first luminous layer 151 and the second luminous layer 152 is to control the contrast and brightness of the first and second images, thereby controlling the ratio of first image to second image during combining them.

In an embodiment, the pixel structure further includes a third luminous layer 152' in the third region that can be deduced by the description related to FIG. 2 and FIG. 6, the driving circuit drives the first luminous layer 151 by the data signal DT and drives the second luminous layer 152 and the third luminous layer 152' by the data signal DT'. Moreover, the brightness and contrast of the second image can slightly be adjusted by the second luminous layer 152 and the third luminous layer 152'.

In the disclosure, the transparent penetrative region of a display (i.e. the second region) is disposed with the second luminous layer and different control components. When the second control component does not operate, the pixel structure may achieve the highest transparent degree, and when the second control component operates, the pixel structure may have high contrast.

What is claimed is:

1. An organic light-emitting diode pixel structure having a first region and a second region, comprising:
   a substrate extended to the first region and the second region;
   a first control component located in the first region on the substrate;
   a first electrode layer located in the first region, and directly electrically connected to the first control component;
   a reflection layer disposed between the first electrode layer and the substrate in the first region;
   a first luminous layer located on the first electrode layer, electrically coupled to the first electrode layer;

a second control component located in the first region on the substrate;

a second electrode layer located in the second region and directly electrically connected to the second control component in the first region;

a second luminous layer located on the second electrode layer and electrically coupled to the second electrode layer; and an opposite electrode layer located on the first luminous layer and the second luminous layer and electrically coupled to the first luminous layer and the second luminous layer, wherein the second electrode layer and the opposite electrode layer are made of transparent material, and there has no reflective layer in the second region.

2. The organic light-emitting diode pixel structure according to claim 1, wherein the first control component comprises a first thin film transistor having a first gate terminal, a first source terminal, a first drain terminal, and a first channel, one of the first source terminal and first drain terminal of the first control component is electrically coupled to the first electrode layer, the first gate terminal of the first control component is disposed on the substrate and is selectively, electrically coupled to a first data line, the first data line is configured to provide the first gate terminal of the first control component with a first data signal, the first channel is electrically coupled to the first source terminal and first drain terminal of the first control component; and the second control component comprises a second thin film transistor having a second gate terminal, a second source terminal, a second drain terminal, and a second channel, one of the second source terminal and second drain terminal of the second control component is electrically coupled to the second electrode layer, the second gate terminal of the second control component is located on the substrate, the second channel is electrically coupled to the second source terminal and second drain terminal of the second control component.

3. The organic light-emitting diode pixel structure according to claim 2, wherein the second gate terminal of the second control component is electrically coupled to the first gate terminal of the first control component.

4. The organic light-emitting diode pixel structure according to claim 2, wherein the second gate terminal of the second control component is electrically coupled to a second data line, the second data line is configured to provide the second gate terminal of the second control component with a second data signal, and the first data signal is different from the second data signal.

5. The organic light-emitting diode pixel structure according to claim 2, further comprising: a gate insulation layer partially located on the substrate, the first control component and the second control component being located on the gate insulation layer partially.

6. The organic light-emitting diode pixel structure according to claim 2, wherein the second control component further comprises a switch unit that is controlled by a switch signal, and the other one of the second source terminal and second drain terminal of the second control component is electrically coupled to the switch unit.

7. The organic light-emitting diode pixel structure according to claim 6, wherein the second gate terminal of the second control component is electrically coupled to the first gate terminal of the first control component.

8. The organic light-emitting diode pixel structure according to claim 6, wherein the second gate terminal of the second control component is electrically coupled to a second data line, the second data line provides the second gate terminal of the second control component with a second data signal, and the first data signal is different from the second data signal.

9. The organic light-emitting diode pixel structure according to claim 6, further comprising: a gate insulation layer partially located on the substrate, the first control component and the second control component being located on the gate insulation layer partially.

10. The organic light-emitting diode pixel structure according to claim 2, wherein the second control component further comprises a switch unit, and the switch unit is controlled by a switch signal and is electrically coupled to the second electrode layer and the second thin film transistor.

11. The organic light-emitting diode pixel structure according to claim 10, wherein the second gate terminal of the second control component is electrically coupled to the first gate terminal of the first control component.

12. The organic light-emitting diode pixel structure according to claim 10, wherein the second gate terminal of the second control component is electrically coupled to a second data line, the second data line provides the second gate terminal of the second control component with a second data signal, and the first data signal is different from the second data signal.

13. The organic light-emitting diode pixel structure according to claim 10, further comprising: a gate insulation layer partially located on the substrate, the first control component and the second control component being located on the gate insulation layer partially.

14. The organic light-emitting diode pixel structure according to claim 1, further comprising: a partition layer located on the substrate and between the first luminous layer and the second luminous layer.

15. The organic light-emitting diode pixel structure according to claim 1, further having a third region and comprising:

a third control component located on the substrate;

a third electrode layer being transparent, located in the third region, and electrically coupled to the third control component; and a third luminous layer located on the third electrode layer and electrically coupled to the third electrode layer;

wherein the substrate is further extended to the third region.

16. The organic light-emitting diode pixel structure according to claim 1, wherein the second region is transparent or translucent.

17. The organic light-emitting diode pixel structure according to claim 1, wherein the first luminous layer emits first light, the second luminous layer emits second light, and the first light and the second light are the same in color.

18. A display, comprising:

the organic light-emitting diode pixel structures in claim 1, arranged in a matrix form; and a driving circuit electrical coupled to the organic light-emitting diode pixel structures, configured to drive the first control component according to first image data to control the first luminous layers to generate a first image according to the first image data, and further configured to drive the second control components according to second image data to control the second luminous layers to generate a second image according to the second image data, wherein the first image is opaque, and the second image is transparent or translucent.

\* \* \* \* \*